(12) United States Patent
Pierrat (10) Patent No.: US 7,165,234 B2
(45) Date of Patent: Jan. 16, 2007

(54) MODEL-BASED DATA CONVERSION

(75) Inventor: Christophe Pierrat, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 304 days.

(21) Appl. No.: 10/844,987

(22) Filed: May 12, 2004

(65) Prior Publication Data

US 2004/0209176 A1 Oct. 21, 2004

Related U.S. Application Data

(62) Division of application No. 10/171,066, filed on Jun. 11, 2002, now Pat. No. 6,785,879.

(51) Int. Cl.
*G06F 17/50* (2006.01)

(52) U.S. Cl. ............... 716/21; 716/5; 716/7; 716/8; 430/5

(58) Field of Classification Search ............ 716/4, 716/19–21; 430/5, 322
See application file for complete search history.

(56) References Cited

U.S. PATENT DOCUMENTS

| | | | |
|---|---|---|---|
| 5,302,477 A | 4/1994 | Dao et al. | 430/5 |
| 5,308,741 A | 5/1994 | Kemp | 430/312 |
| 5,324,600 A | 6/1994 | Jinbo et al. | 430/5 |
| 5,364,716 A | 11/1994 | Nakagawa et al. | 430/5 |
| 5,472,814 A | 12/1995 | Lin | 430/5 |
| 5,523,186 A | 6/1996 | Lin et al. | 430/5 |
| 5,527,645 A | 6/1996 | Pati et al. | 430/5 |
| 5,537,648 A | 7/1996 | Liebmann et al. | 395/500 |
| 5,538,815 A | 7/1996 | Oi et al. | 430/5 |
| 5,565,286 A | 10/1996 | Lin | 430/5 |
| 5,573,890 A | 11/1996 | Spence | 430/311 |
| 5,595,843 A | 1/1997 | Dao | 430/5 |

(Continued)

FOREIGN PATENT DOCUMENTS

DE 195 45 163 A1 6/1996

(Continued)

OTHER PUBLICATIONS

Ackmann, P., et al., "Phase Shifting and Optical Proximity Corrections to Improve CD Control on Logic Devices in Manufacturing for Sub 0.35 um I-Line", SPIE, vol. 3051, pp. 146-153, Mar. 12-14, 1997.

(Continued)

*Primary Examiner*—Vuthe Siek
(74) *Attorney, Agent, or Firm*—Bever, Hoffman & Harms, LLP; Jeanette S. Harms (57) ABSTRACT

Shifters on a phase shifting mask (PSM) can be intelligently assigned their corresponding phase. Specifically, the phase of a shifter can be assigned based on simulating the contrast provided by each phase for that shifter. The higher the contrast, the better the lithographic performance of the shifter. Therefore, the phase providing the higher contrast can be selected for that shifter. To facilitate this phase assignment, a pre-shifter can be placed relative to a feature on the layout. The pre-shifter can then be divided into a plurality of shifter tiles for contrast analysis. Model-based data conversion allows for a comprehensive solution including both phase assignment as well as optical proximity correction.

12 Claims, 9 Drawing Sheets

U.S. PATENT DOCUMENTS

| | | | |
|---|---|---|---|
| 5,620,816 A | 4/1997 | Dao | 430/5 |
| 5,635,316 A | 6/1997 | Dao | 430/5 |
| 5,636,131 A | 6/1997 | Liebmann et al. | 364/490 |
| 5,702,848 A | 12/1997 | Spence | 430/5 |
| 5,761,075 A | 6/1998 | Oi et al. | 364/488 |
| 5,766,804 A | 6/1998 | Spence | 430/5 |
| 5,766,806 A | 6/1998 | Spence | 430/5 |
| 5,807,649 A | 9/1998 | Liebmann et al. | 430/5 |
| 5,858,580 A | 1/1999 | Wang et al. | 430/5 |
| 5,923,562 A | 7/1999 | Liebmann et al. | 364/488 |
| 5,923,566 A | 7/1999 | Galan et al. | 364/489 |
| 5,994,002 A | 11/1999 | Matsuoka | 430/5 |
| 5,998,068 A | 12/1999 | Matsuoka | 430/5 |
| 6,057,063 A | 5/2000 | Liebmann et al. | 430/5 |
| 6,066,180 A | 5/2000 | Kim et al. | 716/19 |
| 6,083,275 A | 7/2000 | Heng et al. | 716/19 |
| 6,130,012 A | 10/2000 | May et al. | 430/5 |
| 6,139,994 A | 10/2000 | Broeke et al. | 430/5 |
| 6,185,727 B1 | 2/2001 | Liebmann | 716/19 |
| 6,228,539 B1 | 5/2001 | Wang et al. | 430/5 |
| 6,251,549 B1 | 6/2001 | Levenson | 430/11 |
| 6,258,493 B1 | 7/2001 | Wang et al. | 430/5 |
| 6,335,128 B1 | 1/2002 | Cobb et al. | 430/5 |
| 6,338,922 B1 | 1/2002 | Liebmann et al. | 430/5 |
| 6,420,074 B1 | 7/2002 | Wang et al. | 430/5 |
| 6,436,590 B1 | 8/2002 | Wang et al. | 430/5 |
| 6,534,242 B1 * | 3/2003 | Sugita et al. | 430/312 |
| 7,013,439 B1 * | 3/2006 | Robles et al. | 716/4 |
| 2001/0000240 A1 | 4/2001 | Wang et al. | 430/5 |
| 2001/0028985 A1 | 10/2001 | Wang et al. | 430/5 |
| 2002/0083410 A1 | 6/2002 | Wu et al. | 716/19 |
| 2002/0122994 A1 | 9/2002 | Cote et al. | 430/5 |
| 2002/0127479 A1 | 9/2002 | Pierrat | 430/5 |
| 2002/0129327 A1 | 9/2002 | Pierrat et al. | 716/19 |
| 2002/0136964 A1 | 9/2002 | Pierrat | 430/5 |
| 2002/0142231 A1 | 10/2002 | Kling et al. | 430/5 |
| 2002/0142232 A1 | 10/2002 | Kling et al. | 430/5 |
| 2002/0144232 A1 | 10/2002 | Ma et al. | 716/21 |
| 2002/0152454 A1 | 10/2002 | Cote et al. | 716/21 |
| 2002/0155363 A1 | 10/2002 | Cote et al. | 430/5 |

FOREIGN PATENT DOCUMENTS

| | | |
|---|---|---|
| EP | 0 653 679 A2 | 5/1995 |
| GB | 2333613 | 7/1999 |
| JP | 62067547 | 3/1987 |
| JP | 2-140743 | 5/1990 |
| JP | 1283925 | 2/1991 |
| JP | 6-67403 | 3/1994 |
| JP | 8051068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 98/12605 A1 | 3/1998 |
| WO | WO 01/23961 A1 | 4/2001 |
| WO | WO 02/03140 A1 | 1/2002 |
| WO | WO 02/073312 | 9/2002 |

OTHER PUBLICATIONS

Matsuoka, K., et al., "Application of Alternating Phase-Shifting Mask to 0.16um CMOS Logic Gate Patterns", Matsushita Electric Ind. Co., Ltd. (9 pages), no date.

Wang, R., et al., "Plarized Phase Shift Mask: Concept, Design, and Potential Advantages to Photolithography Process and Physical Design". Motorola Semiconductor Product Sector (12 pages), no date.

Ogawa, K., et al., "Phase Defect Inspection by Differential Interference", Lasertec Corporation (12 pages), no date.

Pistor, T., "Rigorous 3D Simulation of Phase Defects in Alternating Phase-Shifting Masks", Panoramic Technology Inc. (13 pages), no date.

Semmier, A., et al., "Application of 3D EMF Simulation for Development and Optimization of Alternating Phase Shifting Masks", Infineon Technologies AG (12 pages), no date.

Wong, A., et al., "Polarization Effects in Mask Transmission", University of California Berkeley (8 pages), no date.

Erdmann, A., "Topography Effects and Wave Aberrations in Advanced PSM-Technology", Fraunhofer Institute of Integrated Circuits (11 pages), no date.

Granik, Y., et al., "CD Variation Analysis Technique and its Application to the Study of PSM Mask Misalignment", Mentor Graphics (9 pages), no date.

Hanyu, et al., "New Phase-Shifting Mask with Highly Transparent SiO2 Phase Shifters", Fujitsu Laboratories Ltd. (11 pages), no date.

Ishiwata, N., et al., "Fabrication of Phase-Shifting Mask", Fujitsu Limited (11 pages), no date.

Levenson, M., et al., "Phase Phirst! An Improved Strong-PSM Paradigm", M.D. Levenson Consulting, Petersen Advanced Lithography, KLA-Tencor (10 pages), no date.

Levenson, M., et al., "SCAA Mask Exposures and Phase Phirst Design for 110nm and Below", M.D. Levenson Consulting, Canon USA, Inc., JSR Microelectronics, Inc. (10 pages), no date.

Lin, B.J., "The Relative Importance of the Building Blocks for 193nm Optical Lithography", Linnovation, Inc. (12 pages), no date.

McCallum, M., et al., "Alternating PSM Mask Performance—a Study of Multiple Fabrication Technique Results", International SEMATECH (6 pages), no date.

Morikawa, Y., et al., "100nm-alt.PSM Structure Discussion for ArF Lithography", Dai-Nippon Printing Co., Ltd. (15 pages), no date.

Ozaki, T., et al., "A 0.15um KrF Lithography for 1Gb DRAM Product Using Highly Printable patterns and Thin Resist Process", Toshiba Corporation (2 pages), no date.

Rhyins, P., et al., "Characterization of Quartz Etched PSM Masks for KrF Lithography at the 100nm Node", Photronics, Inc., MIT Lincoln Lab, ARCH Chemicals, Finle Technologies, KLATencor Corp. (10 pages), no date.

Rosenbluth, A., et al., "Optimum Mask and Source Patterns to Print a Given Shape", IBM (17 pages), no date.

Schmidt, R., et al., "Impact of Coma on CD Control for Multiphase PSM Designs", AMD, ASML (10 pages), no date.

Sewell, H., et al., "An Evaluation of the Dual Exposure Technique", SVG Lithography Systems Inc. (11 pages), no date.

Spence, C., et al., "Optimization of Phase-Shift Mask Designs Including Defocus Effects", AMD, Princeton University, Vecor Technologies Inc. (8 pages), no date.

Suzuki, A., et al., "Multilevel Imaging System Realizing k1=-.3 Lithogrpahy", Canon Inc. (13 pages), no date.

Vandenberghe, G., et al., "(Sub-)100nm Gate Patterning Using 248nm Alternating PSM", IMEC, Mentor Graphics (9 pages), no date.

Fritze, M., et al., "100-nm Node Lithography with KrF?", MIT Lincoln Lab, Numberical Technologies, Photronics. Arch Chemicals (14 pages), no date.

Fukuda, II., et al., "Patterning of Random Interconnect Using Double Exposure of Strong-Type PSMs". Ilitachi Central Research Lab (8 pages), no date.

Ferguson, R., et al., "Pattern-Dependent Correction of Mask Topography Effects for Alternating Phase-Shifting Masks", IBM Microelectronics, University of California Berkeley (12 pages), no date.

Toublan, O., et al., "Phase and Transmission Errors Aware OPC Solution for PSM: Feasibility Demonstration", Mentor Graphics Corp. (7 pages), no date.

Yanagishita, Y., et al., "Phase-Shifting Photolithography Applicable to Real IC Patterns", Fujitsu Limited (11 pages), no date.

Levenson, M., et al., "Improving Resolution in Photolithography with a Phase-Shifting Mask", IEEE, Transactions On Electron Devices, vol. ED-29, No. 12, pp. 1828-1836, Dec. 1982.

Levenson, M., et al., "The Phase-Shifting Mask II: Imaging Simulations and Submicrometer Resist Exposures", IEEE Transactions on Electron Devices, vol. ED-31, No. 6, pp. 753-763, Jun. 1984.

Terasawa, T., et al., "0.3-Micron Optical Lithography Using a Phase-Shifting Mask", SPIE, Optical/Laser Microlithography II, vol. 1088, pp. 25-33, Mar. 1989.

Nitayama, A., et al., "New Phase Shifting Mask with Self-Aligned Phase Sifters for a Quarter Micron Photolithography", IEDM, pp. 3.3.1-3.3.4. Dec. 3-6, 1989.

Jinbo, H., et al., "0.2um or Less i-Line Lithography by Phase-Shifting-Mask Technology", IEEE, pp. 33.3.1-33.3.4 (1990).

Neureuther, A., "Modeling Phase Shifting Masks", SPIE. 10th Annual Symposium On Microlithography. vol. 1496, pp. 80-85 (1990).

Yamanaka, T., et al., "A 5.9um2 Super Low Power SRAM Cell Using a New Phase-Shift Lithography", IEDM, pp. 18.3.1-18.3.4 (1990).

Inokuchi, K., et al., "Sub-Quarter Micron Gate Fabrication Process Using Phase-Shifting-Mask for Microwave GaAs Devices", Extended Abstracts Of The 1991 Intl. Conference On Solid State Devices And Materials, Yokohama, Japan, pp. 92-94 (1991).

Inokuchi, K., et al., "Sub-Quarter-Micron Gate Fabrication Process Using Phase-Shifting Mask for Microwave GaAs Devices", Japanese Journal Of Applied Physics, vol. 30, No. 12B, pp. 3818-3821, Dec. 1991.

Jinbo, H., et al., "Improvement of Phase-Shifter Edge Line Mask Method", Japanese Journal Of Applied Physics, vol. 30, No. 11B, pp. 2998-3003, Nov. 1991.

Kimura, T., et al., "Subhalf-Micron Gate GaAs Mesfet Process Using Phase-Shifting-Mask Technology", IEEE, GaAs IC Symposium, pp. 281-284 (1991).

Wiley, J., et al., "Phase Shift Mask Pattern Accuracy Requirements and Inspection Technology", SPIE, Integrated Circuit Metrology, Inspection. And Process Control V; vol. 1464, pp. 346-355 (1991).

Ilirai, Y., et al., "Automatic Pattern Generation System for Phase Shifiting Mask", 1991 Symposium on VLSI Technology. Digest of Technical Papers, pp. 95-96, May 28-30, 1991.

Wong, A., et al., "Investigating Phase-Shifting Mask Layout Issues Using a Cad Toolkit", IEEE, pp. 27.4.1-27.4.4 (1991).

Terasawa, T., et al., "Imaging Characteristics of Multi-Phase-Shifting and Halftone Phase-Shifting Masks", Japanese Journal of Applied Physics, vol. 30, No. 11B, pp. 2991-2997, Nov. 1991.

Burggraaf, P., "Four More Significant Japanese Advances in Phase Shifting Technology", Semiconductor International, p. 16, Dec. 1991.

Kemp, K., et al., "Optimized Phase Shift Mask Designs for Real Devices", KTI Microlithography Seminar, pp. 67-75, Oct. 14-15, 1991.

Newmark, D., et al., "Phase-Shifting Mask Design Tool", SPIE—11th Annual BACUS Symposium on Photmask Technology, vol. 1604, pp. 226-235, Sep. 25-27, 1991.

Nolscher, C., et al., "Investigation of Self-Aligned Phase-Shifting Reticles by Simulation Techniques", SPIE—Optical/Laser Microlithography IV. vol. 1463, pp. 135-150 (1991).

Inoue, S., et al., "Simulation Study on Phase-Shifting Masks for Isolated Patterns", Japanese Journal of Applied Physics, vol. 30, No. 11B, pp. 3010-3015, Nov. 1991.

Watanabe, H., et al., "Detection and Printability of Shifter Defects in Phase-Shifting Masks", Japanese Journal of Applied Physics, vol. 30, No. 11B, pp. 3016-3020, Nov. 1991.

Watanabe, H., et al., "Pattern Transfer Characteristics of Transparent Phase Shifting Mask", Japanese Journal of Applied Physics, vol. 30, No. 11B, pp. 3004-3009, Nov. 1991.

Jinbo, H., et al., "Application of Blind Method to Phase-Shifting Lithography", IEEE, 1992 Symposium On VLSI Technology Digest Of Technical Papers, pp. 112-113 (1992).

Watanabe, H., et al., "Detection and Printability of Shifter Defects in Phase-Shifting Masks II Defocus Characteristics", Jpn. J. Appl. Phys., vol. 31, pp. 4155-4160 (1992).

Pierrat, C., et al., "Phase-Shifting Mask Topography Effects on Lithographic Image Quality", IEEE, pp. 3.3.1-3.3.4 (1992).

Burggraaf, P., "Lithography's Leading Edge, Part I: Phase-Shift Technology and Part 2: I-Line and Beyond", Semiconductor International. pp. 43-47 and 52-56, Feb. 1992.

IBM, "Phase-Shift Mask Utilizing Silicon Oxy-Nitride as a Low Reflectivity Phase-Shift Layer". IBM Technical Disclosure Bulletin, vol. 34, No. 10B, pp. 360-361, Mar. 1992.

Brunner, T., et al., "170nm Gates Fabricated by Phase-Shift Mask and Top Anti-Reflector Process", SPIE, Optical/Laser Microlithography VI, Vo. 1927, pp. 182-189 (1993).

Lin, B.J., "Phase-Shifting Masks Gain an Edge", IEEE Circuits & Devices, pp. 28-35, Mar. 1993.

Moniwa, A., et al., "Algorithm for Phase-Shift Mask Design with Priority on Shifter Placement", Jpn. J. Appl. Phys., vol. 32, Pt. 1. No. 12B, pp. 5874-5879, Dec. 1993.

Ooi, K., et al., "Computer Aided Design Software for Designing Phase-Shifting Masks", Jpn. J. Appl. Phys., vol. 32, Pt. 1, No. 12B, pp. 5887-5891, Dec. 1993.

Ohtsuka, H., et al., "Evaluation of Repair Phase and Size Tolerance for a Phase-Shift Mask", J. Vac. Sci. Technol. B. vol. 11, No. 6, pp. 2665-2668. Nov./Dec. 1993.

Ronse, K., et al., "Comparison of Various Phase Shift Strategies and Application to 0.35um ASIC Designs", SPIE—Optical/Laser Microlithography VI, vol. 1927, pp. 2-16 (1993).

Galan, G., et al., "Application of Alternating-Type Phase Shift Mask to Polysilicon Level for Random Logic Circuits", Jpn. J. Appl. Phys., vol. 33, pp. 6779-6784 (1994).

Mizuno, F., et al., "Practical Phase-Shifting Mask Technology for 0.3um Large Scale Integrations", J. Vac. Sci. Technol. B, vol. 12, No. 6, pp. 3799-3803, Nov./Dec. 1994.

Pati, Y.C., et al., "Phase-Shifting Masks for Microlithography: Automated Design and Mask Requirements", J. Opt. Soc. Am., vol. 11, No. 9, pp. 2438-2452, Sep. 1994.

Stimiman, J., et al., "Wafer Proximity Correction and Its Impact on Mask-Making". Bacus News, vol. 10, Issue 1, pp. 1, 3-7, Jan. 10-12, 1994.

Waas, T., et al., "Automatic Generation of Phase Shift Mask Layouts", Microelectronic Engineering, vol. 23, pp. 139-142 (1994).

Barouch, E., et al., "OPTIMASK: An OPC Algorithm for Chrome and Phase-Shift Mask Design", SPIE, Vo. 2440, pp. 192-206, Feb. 1995.

Moniwa, A., et al., "Heuristic Method for Phase-Conflict Minimization in Automatic Phase-Shift Mask Design", Jpn. J. Appl. Phys., vol. 34, Pt. 1, No. 12B, pp. 6584-6589, Dec. 1995.

Langston, J., et al., "Extending Optical Lithography to 0.25um and Below", Solid State Technology. pp. 57-64, Mar. 1995.

Nagahiro, Y., "Improved Mask Technique for Photolithography Applied to 0.25um LSI—Improvement of Resolution, Pattern Correction. Exposure Area". Nikkei Microdevices, pp. 1-6, Apr. 1995.

Okamoto, Y., et al., "A New Phase Shifting Mask Technology for Quarter Micron Photolithography", SPIE, vol. 2512, pp. 311-318 (1995).

Pierrat, C., et al., "Required Optical Characteristics of Materials for Phase-shifting Masks", Applied Optics, vol. 34, No. 22, pp. 4923-4928, Aug. 1, 1995.

Galan, G., et al., "Alternating Phase Shift Generation for Coplex Circuit Designs", SPIE, vol. 2884, pp. 508-519, Sep. 18-20, 1996.

Kanai, H., et al., "Sub-Quarter Micron Lithography with the Dual-Trench Type Alternating PSM", SPIE, vol. 2793, pp. 165-173 (1996).

Ishiwata, N., et al., "Novel Alternating Phase Shift Mask with Improved Phase Accuracy", SPIE, Proceedings Of The 17th Annual Symposium On Photomask Technology And Management, vol. 3226, pp. 243-249 (1997).

Morimoto, H., et al., "Next Generation Mask Strategy—Technologies are Ready for Mass Production of 256MDRAM?", SPIE. vol. 3236, pp. 188-189 (1997).

Roman, B., et al., "Implications of Device Processing on Photomask CD Requirements", SPIE, vol. 3236 (1997) (Abstract Only).

Nakae, A., et al., "A Proposal for Pattern Layout Rule in Application of Alternating Phase Shift Mask", SPIE, vol. 3096, pp. 362-374 (1997).

Tsujimoto, E., et al., "Hierarchical Mask Data Design System (PROPHET) for Aerial Image Simulation, Automatic Phase-Shifter Placement, and Subpeak Overlap Checking", SPIE, vol. 3096, pp. 163-172 (1997).

Yamamoto, K., et al., "Hierarchical Processing of Levenson-Type Phase Shifter Generation", Jpn. J. Appl. Phys., vol. 36, Part 1, No. 12B. pp. 7499-7503, Dec. 1997.

Gordon, R., et al., "Design and Analysis of Manufacturable Alternating Phase-Shifting Masks", Bacus News, vol. 14, Issue 12, pp. 1-9, Dec. 1998.

Nara, M., et al., "Phase Controllability Improvement for Alternating Phase Shift Mask", Dai Nippon Printing Co., Ltd. (16 pages), no date.

Ohnuma, II., et al., "Lithography Computer Aided Design Technology for Embedded Memory in Logic", Jpn. J. Appl. Phys., vol. 37, Part I. No. 12B, pp. 6686-6688, Dec. 1998.

Fukuda, H., "Node-Connection/Quantum Phase-Shifting Mask: Path to Below 0.3um Pitch, Proximity Effect Free, Random Interconnects and Memory Patterning", J. Vac. Sci. Technol. B, vol. 17, No. 6, pp. 3291-3295. Nov./Dec. 1999.

Spence, C., et al., "Integration of Optical Proximity Correction Strategies in Strong Phase Shifters Design for Poly-Gate Layers", Bacus News, vol. 15, Issue 12, pp. 1, Dec. 4-13, 1999.

Kuo, C., et al., "Extension of Deep-Ultraviolet Lithography for Patterning Logic Gates Using Alternating Phase Shifting Masks", J. Vac. Sci. Technol. B. vol. 17, No. 6, pp. 3296-3300, Nov./Dec. 1999.

Palmer, S., et al., "Dual Mask Model-Based Proximity Correction for High Performance 0.10um CMOS Process", The 44th International Conference on Electron. Ion and Photon Beam Technology and Nanofabrication Abstracts. pp. 18-19, May 30-Jun. 2000.

Pierrat, C., "Investigation of Proximity Effects in Alternating Aperture Phase Shifting Masks", Numerical Technologies. Inc. (11 pages), no date.

Kikuchi, K., et al., "Method of Expanding Process Window for the Double Exposure Technique with alt-PSMs", Optical Microlithography XIII, Proceeding of SPIE, vol. 4000, pp. 121-131 (2000).

Cote, M., et al., "A Practical Application of Full-Feature Alternating Phase-Shifting Technology for a Phase-Aware Standard-Cell Design Flow", Numerical Technologies Inc. (6 pages), no date.

Heng, F., et al., "Application of Automated Design Migration to Alternating Phase Sifht Mask Design", IBM Research Report RC 21978 (98769), Feb. 26, 2001 (7 pages).

Wong, A., et al., "Alternating Phase-Shifting Mask with Reduced Aberration Sensitivity: Lithography Considerations", Proc. SPIE, vol. 4346, pp. 1-9 (2001).

Liebmann, L.W., et al., "TCAD Development For Lithography Resolution Enhancement", IBM J. Res. & Dev., vol. 45, No. 5, pp. 651-665. Sep. 5, 2001.

Anonymous. "PSMLint—Phase Shifting Mask Physical Verification Level Type Checking", IPCOM000007351D, Mar. 18, 2002 (9 pages).

Anonymous, "PSM Library And Place And Route", IPCOM000007571D, Apr. 5, 2002 (10 pages).

Anonymous, "Non-Critical Blocking For Full Phase Masks". IPCOM000007568D, Apr. 5, 2002 (14 pages).

Anonymous, "Full Phase Mask in Damascene Process", IPCOM000007569D. Apr. 5, 2002 (7 pages).

Liehmann, L., et al., "Enabling Alternating Phase Shifted Mask Designs For A Full Logic Gate Level", J. Microlith., Microfab., Microsyst., vol. 1, No. 1, pp. 31-42, Apr. 2002.

Borodovsky, Y., et al., "Lithography Strategy For 65nm Node", Intel, PMJ 2002, Yokohama, Japan, pp. 1-33, Apr. 23-25, 2002.

Cooke, M., "OPC/PSM Designs For Poly Gate Layers", European Semiconductor, vol. 22, No. 7, pp. 57-59, Jul. 2000.

Granik, Y., et al., "Sub-Resolution Process Windows And Yield Estimation Technique Based On Detailed Full-Chip CD Simulation", SPIE, vol. 4182, pp. 335-341 (2000).

Plat, M., et al., "The Impact of Optical Enhancement Techniques on the Mask Error Enhancement Funchtion (MEEF)", SPIE, vol. 4000, pp. 206-214, Mar. 1-3, 2000.

Mansuripur, M., et al., "Projection Photolithography". Optics & Photonics News 11. 17 pages. Feb. 2000.

* cited by examiner

MODEL-BASED DATA CONVERSION

RELATED APPLICATIONS

This application is a divisional of U.S. patent application Ser. No. 10/171,066, entitled "Model-Based Data Conversion" filed Jun. 11, 2002 now U.S. Pat. No. 6,785,879.

BACKGROUND OF THE INVENTION

1. Field of the Invention

The present invention relates to phase shifting masks and, in particular, to the use of model-based tools to facilitate phase assignment on the phase shifting masks.

2. Discussion of the Related Art

Lithography is a well-known process used in the semiconductor industry to form lines, contacts, and other known structures in integrated circuits (ICs). In conventional lithography, a mask (wherein the term "mask" as used herein can refer to a mask or a reticle) having a pattern of transparent and opaque regions representing such structures in one IC layer is illuminated. The emanating light from the mask is then focused onto a photoresist layer provided on a wafer. During a subsequent development process, portions of the photoresist layer are removed, wherein the portions are defined by the pattern. In this manner, the pattern of the mask is transferred to (i.e. printed on) the photoresist layer.

However, diffraction effects at the transition of the transparent regions to the opaque regions on the mask can render the corresponding printed edges on the wafer indistinct, thereby adversely affecting the resolution of the lithography process. Various techniques have been proposed to improve the resolution. One such technique, phase shifting, uses phase destructive interference of the waves of incident light. Specifically, phase shifting shifts the phase of a first region of incident light waves approximately 180 degrees relative to a second, adjacent region of incident light waves to create a feature between the first and second regions. Thus, a feature, as defined by exposed and unexposed portions of a photoresist illuminated through a mask, can be more closely defined by using phase shifting, thereby allowing greater structure density on the IC. Typically, features generated by phase shifting can then be protected from exposure by using a "trim" mask, which is used to expose the remaining field.

As the need for feature density increases, phase shifting is being applied to many features on the layout. In one embodiment, called a full phase approach, substantially all features of a layer can be defined using phase shifting. However, using phase shifting in dense layouts can result in phase conflicts. Phase conflicts can negate the optical interference necessary to create the desired feature(s). Therefore, assigning phase to the layout can constitute a time-intensive, but mandatory part of typical process flows in the production of many integrated circuits.

Other modifications can be made to the layout to optimize printing resolution. For example, a process called optical proximity correction (OPC) can be used to compensate for non-linear distortions caused by optical diffraction and resist process effects when transferring the pattern from the mask to the wafer. Advanced computer-implemented tools can simulate (i.e. predict) a real pattern transfer with a set of mathematical formulas (i.e. models). In simulating pattern transfer, a simulation tool can use one or multiple models with the layout to generate an OPC-modified layout.

Figure 1:
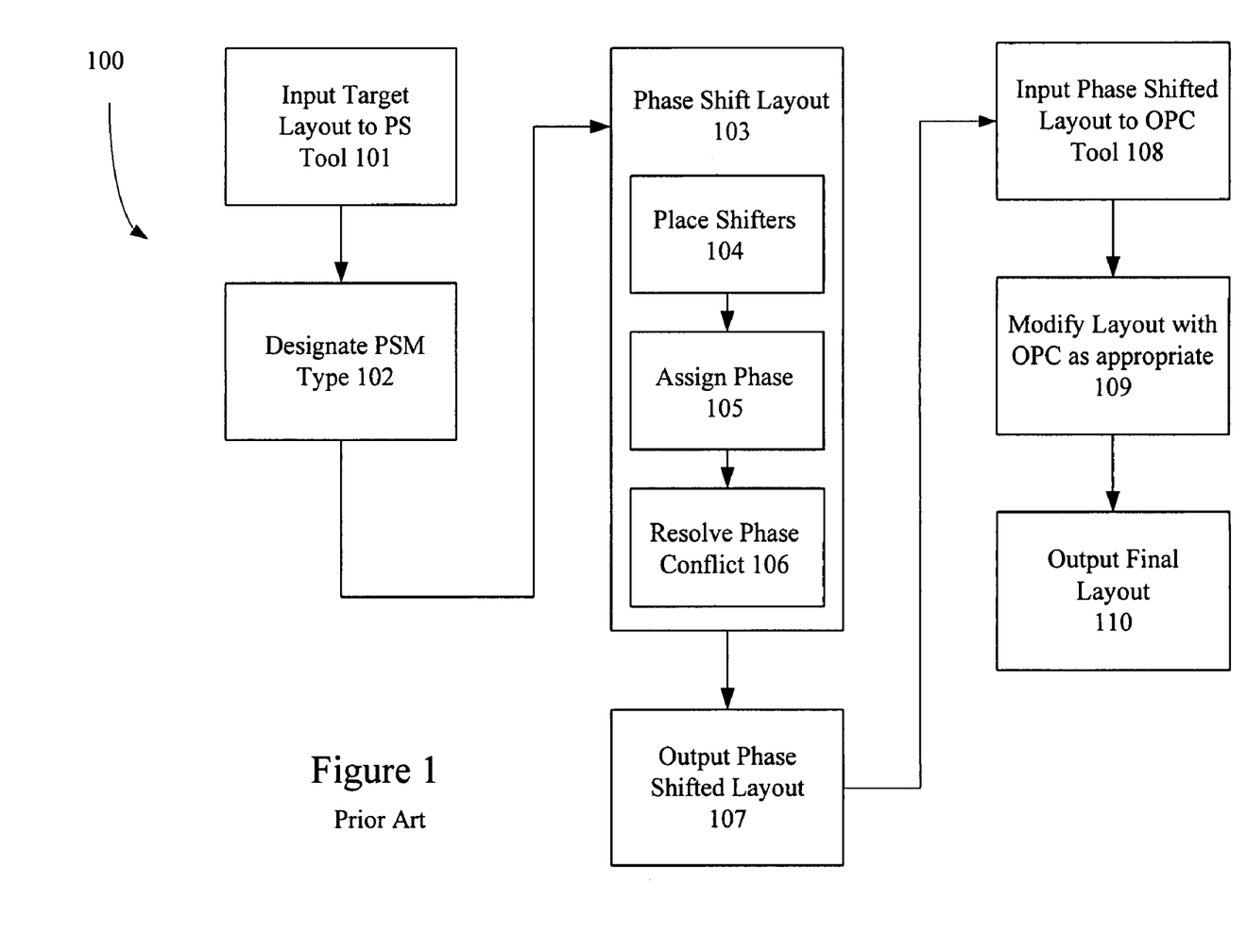
FIG. 1 illustrates a standard process flow including phase assignment as well as OPC.

FIG. 1 illustrates a standard process flow 100 including phase assignment as well as OPC. In step 101 of process flow 100, a target layout can be provided to a phase shifting tool for analysis. In one embodiment, the iN-Phase™ tool, licensed by Numerical Technologies, Inc., can be used. The PSM type, e.g. double exposure alternating aperture phase shifting, can be designated in step 102. Step 103, in which phase shifting is applied to the target layout, can include the steps of placing the shifters in the layout (step 104), assigning phase to the shifters (step 105), and resolving any phase conflicts (step 106). Step 105 may include algorithms for assigning phases to the shifters.

The algorithms used are based phase dependencies and, optionally, costs. By describing the dependencies in one or more data structures, the algorithms can attempt to solve the problem. See, e.g., U.S. patent application Ser. No. 09/823,380, filed Mar. 29, 2001, entitled, "Incrementally Resolved Phase-shift Conflicts In Layouts For Phase-Shifted Features", and U.S. patent application Ser. No. 10/085,759, filed Feb. 28, 2002, entitled "Design And Layout Of Phase Shifting Photolithographic Masks", both of which are incorporated by reference herein. Performing these algorithms to assign phase can be extremely time consuming and require a separate computer program and/or software to be maintained for performing phase assignment, as opposed to the simulation engine for model-based optical proximity correction.

After being output in step 107, the phase shifted layout can then be input to a tool that applies OPC. In one embodiment, the tool for applying phase shifting is different than the tool for providing OPC. In another embodiment, the same tool can provide both phase shifting and OPC. For example, the iN-Phase™ tool, licensed by Numerical Technologies, Inc., can assign phase to shifters as well as perform OPC of a finished layout. In step 109, the layout can be modified as appropriate. At this point, the final layout can be output in step 110. Unfortunately, in either embodiment, significant time is spent reading (or streaming out) and then streaming in the phase shifted layout (steps 107 and 108).

Therefore, a need arises for an accurate and time effective method and system for assigning phase to shifters in a model-based environment.

SUMMARY OF THE INVENTION

In accordance with one feature of the invention, shifters on a phase shifting mask (PSM) can be assigned their corresponding phase through the use of a simulation engine of the type normally used for model-based optical proximity correction (OPC). Specifically, instead of using an algorithm based on phase dependencies, the phase of a shifter can be assigned based on simulating the image contrast provided by each phase for that shifter. The higher the contrast, the better the lithographic performance of the shifter. Therefore, the phase providing the higher contrast can be selected for that shifter.

To provide this simulation-based phase assignment, a pre-shifter, or shifter shape, can be placed relative to a feature on the layout. In one embodiment, the pre-shifter can be placed close to all edges of the feature, thereby surrounding the feature. The pre-shifter can then be divided into a plurality of shifter tiles along the edges where the shifters abut the feature. This division can be done using an OPC engine's dissection capabilities. A first contrast and a second contrast can be calculated by assigning a first phase and a second phase, respectively, to a shifter tile. In multi-phase phase shifting masks, additional contrasts can be computed for each phase possibility. A phase for the shifter tile can be selected based on whichever contrast is higher (and will more accurately produce the feature at the target dimension).

These steps can be repeated for multiple shifter tiles for the feature as well as other features on the layout. In another embodiment, all the evaluation points can be calculated at the same time using the 0 degree/180 degree options to determine which option give the best contrast.

In one embodiment, the pre-shifter can be cut at predetermined areas of the feature. For example, the predetermined areas can include corners of the feature. In this manner, phase conflicts can be avoided. In another embodiment, cuts are not made to the pre-shifter at line ends. Specifically, a trim mask (which will be used in conjunction with the PSM) can be used to define the line end, thereby rendering shifters unnecessary for this region.

The trim mask includes a plurality of trim regions for protecting the features defined by the PSM. In accordance with another feature of the invention, a trim region can be placed relative to a feature on the layout. This trim region, like the pre-shifter, can be divided into a plurality of trim tiles. In one embodiment, the dividing of the pre-shifter and the trim region can be based on dissection points provided on the feature. Note that these trim tiles can be shaped in response to the cuts made to the pre-shifter.

After phases for the shifter tiles are assigned using image contrast comparison, adjacent shifter tiles having identical phase can be merged, thereby improving the manufacturability of the PSM. The trim tiles corresponding to the merged adjacent shifter tiles can also be merged, thereby also improving the manufacturability of the trim mask.

In one embodiment, after or during phase selection for the plurality of shifter tiles, the process can be repeated for that feature, thereby allowing some fine-tuning of shifter phase. In another embodiment, the effect of optical proximity correction (OPC) associated with at least one shifter tile can be analyzed. Note that OPC can also advantageously ensure that a valid comparison is made between the two image contrast simulations. For example, for each tile, the contrast of the image with OPC can be calculated. Based on the contrast, the tile can be assigned a phase. After all tiles are assigned a phase, the OPC can be performed. In another embodiment, the OPC of a tile could be performed after phase assignment of that tile. After phase assignment and OPC of all tiles, additional OPC iterations could be performed, as necessary.

In accordance with one feature of the invention, the simulation-based assignment of phase to shifters can be performed using model-based data conversion. Model-based data conversion provides significant functionality and control mechanisms. For example, the dissection points provided on the feature (e.g. previously used solely for OPC) can be advantageously used for both phase assignment as well as OPC.

In this manner, processes that would previously be performed separately, thereby requiring a streaming out of data and then a subsequent streaming in of data (by either the same or even different tools), can be integrated into a comprehensive process. Thus, model-based data conversion can significantly reduce the total time associated with performing phase assignment and OPC.

Moreover, because of the significant functionality and control mechanisms associated with model-based data conversion, a user can avoid an uncorrectable layout. Specifically, the image contrast comparison reflects an objective standard that can be used to judge the lithographic performance of a shifter. Moreover, phase shifting and OPC can occur sequentially or in conjunction with one another, thereby allowing modifications to the layout that could not be done before the model-based data conversion approach.

Embodiments of the invention can include computer software for placing the pre-shifters around the features, dividing the pre-shifters into shifter tiles, determining the contrasts provided by the simulation images using different phases, and selecting the appropriate phases for the shifters. The computer software can include a source code segment for dividing the pre-shifters using dissection points. The computer software can further include a source code segment for dividing the shifter tiles into shifter segments, thereby allowing even more detailed analysis to be performed. A source code segment can also be provided for grouping a set of adjacent shifter tiles having a same phase to simplify manufacturing of the PSM. Finally, a source code segment can be provided for including OPC in at least one shifter tile.

Embodiments of the invention can also include a photolithographic mask manufactured with a layout generated using model-based data conversion. The photolithographic mask can include a dark field mask having a plurality of shifters. The following process can define the shifters. A pre-shifter can be placed proximate to the edges of a feature on the layout. The pre-shifter can be divided into a plurality of shifter tiles. First and second contrasts provided by assigning first and second phases, respectively, to a shifter tile can be determined. A phase for the shifter tile can be selected based on the step of determining. The steps of determining the contrasts and selecting the phase can be repeated for other shifter tiles. In one embodiment, the effect of optical proximity correction (OPC) for one or more shifter tiles can be analyzed in conjunction with phase assignment. The process can be repeated for other features.

Embodiments of the invention can include a tool for defining a layout for a phase shifting mask (PSM). The tool can include means for comparing a first contrast provided by assigning a first phase to a shifter on the layout and a second contrast provided by assigning a second phase to the shifter, means for selecting whichever of the first and second phases provides an overall better contrast, and means for repeating the steps of comparing and selecting for multiple shifters on the layout. The tool can further include means for providing optical proximity correction (OPC) associated with at least one shifter as well as means for modifying characteristics of that shifter. In one embodiment, the means for comparing and providing perform simulations. Of importance, the means for repeating and providing can be structured without streaming there between.

In another embodiment of the invention, process latitude can replace contrast of the image as the metric. For example, a critical dimension (CD) error range could be compared using the same predetermined dose and focus latitude for each phase, thereby determining which phase would minimize the CD error range. In another example, the range of process latitude for a given CD tolerance change could be computed for both phases, thereby identifying the phase that results in the greater process latitude.

DETAILED DESCRIPTION OF THE FIGURES

In accordance with one feature of the invention, phase assignment of a phase shifting mask (PSM) can be performed in a model-based environment, thereby significantly increasing the accuracy, functionality, and speed of such phase assignment.

Figure 2A:
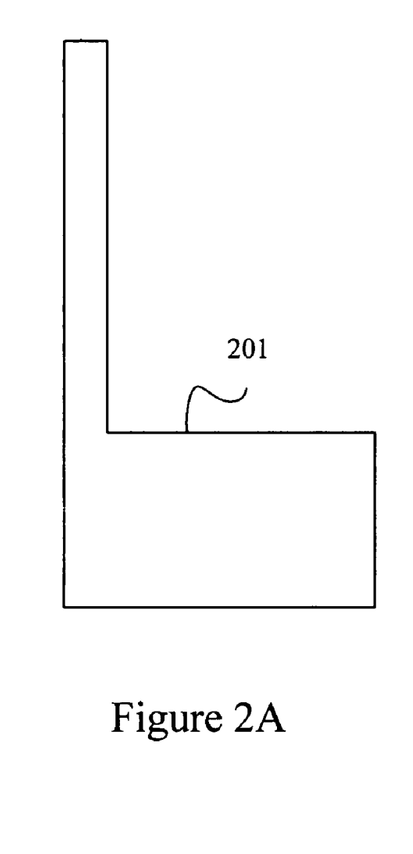
FIG. 2A illustrates a simple feature that could be provided in a layout.

FIG. 2A illustrates a feature 201, which could be provided in a layout. In accordance with one feature of the invention shown in FIG. 2B, a "pre-shifter" 203 having a predetermined phase can be placed around feature 201. Pre-shifter 203 acts as a placeholder or generic shifter that indicates possible shifter locations. As explained in reference to FIGS. 2C–2F, pre-shifter 203 can be manipulated, e.g. cut and "colored" (i.e. assigned a phase), using model-based tools to form the shifters needed to define feature 201. Note that pre-shifter 203 typically extends at least to the edges of feature 201 (i.e. sometimes the shifters slightly overlap the feature). However, to clarify the position of feature 201 as well as a trim region 202, only the portion of pre-shifter 203 extending beyond trim region 202 is shown in FIG. 2B.

Figure 2B:
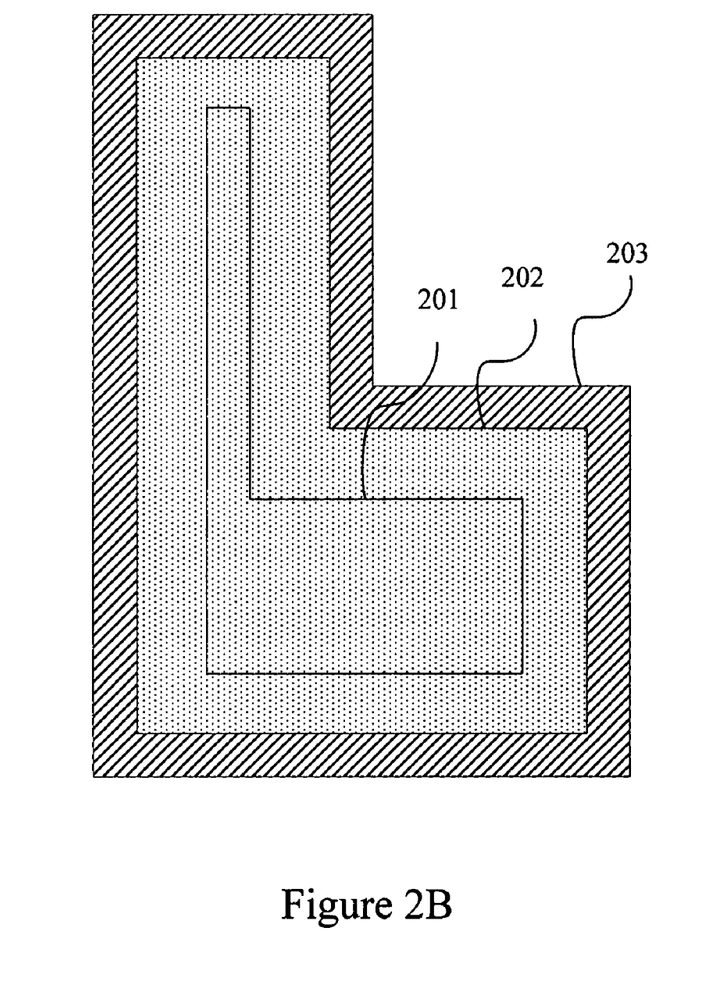
FIG. 2B illustrates a pre-shifter having a predetermined phase, which can be placed relative to the feature. The pre-shifter can act as a placeholder or generic shifter that indicates possible shifter locations.

Specifically, FIG. 2B illustrates a trim region 202, which can be positioned to protect feature 201 as defined using the to-be formed shifters. Of importance, trim region 202, which can be provided as part of a trim mask, can also be advantageously manipulated, e.g. cut, in conjunction with pre-shifter 203 to provide the appropriate protection for feature 201. Thus, FIG. 2B illustrates the superimposed, pre-manipulation layouts from a PSM, which would include feature 201 (formed from chrome) and pre-shifter 203 (formed from a transparent material), and a trim mask, which would include trim region 202 (also formed from chrome). Note that, for simplicity, trim region 202 is not shown in FIGS. 2C–2E. However, in one embodiment, trim region 202 can be manipulated in a manner similar to that described for pre-shifter 203.

Figure 2C:
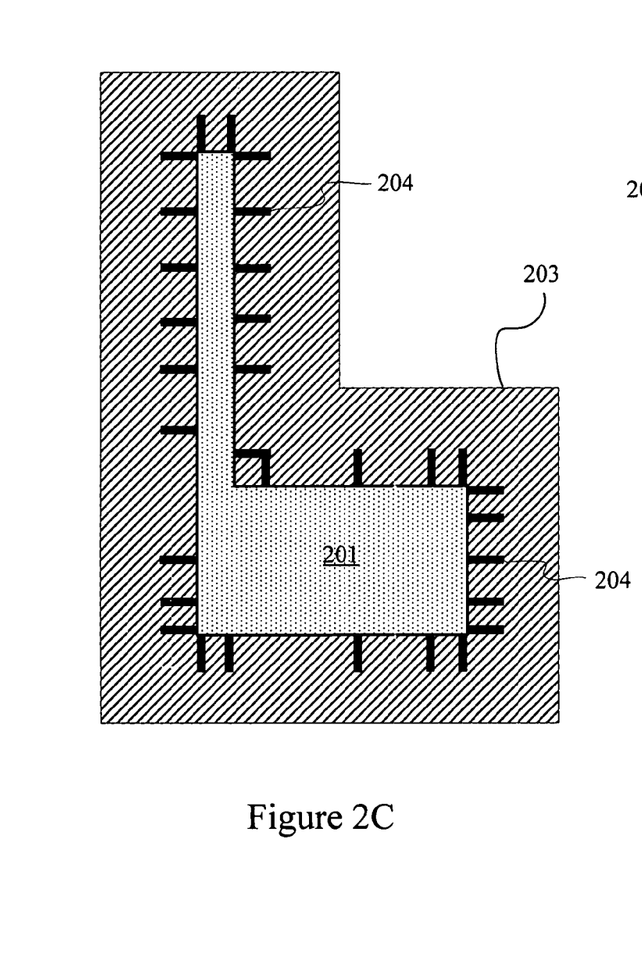
FIG. 2C illustrates a plurality of dissection points associated with an edge of the feature.

In a model-based tool, the edges of a feature can be dissected into a plurality of segments, thereby allowing these segments to be individually moved to correct for proximity effects. FIG. 2C illustrates a plurality of dissection points 204 associated with feature 201. The placement of dissection points 204 is determined by the feature shape, size, and/or position relative to other features. For example, in some embodiments, a fixed dissection length can be used for edges, e.g. every N nm. In other embodiments, multiple dissection lengths are provided, e.g. inner corner, outer corner, etc.

Figure 2D:
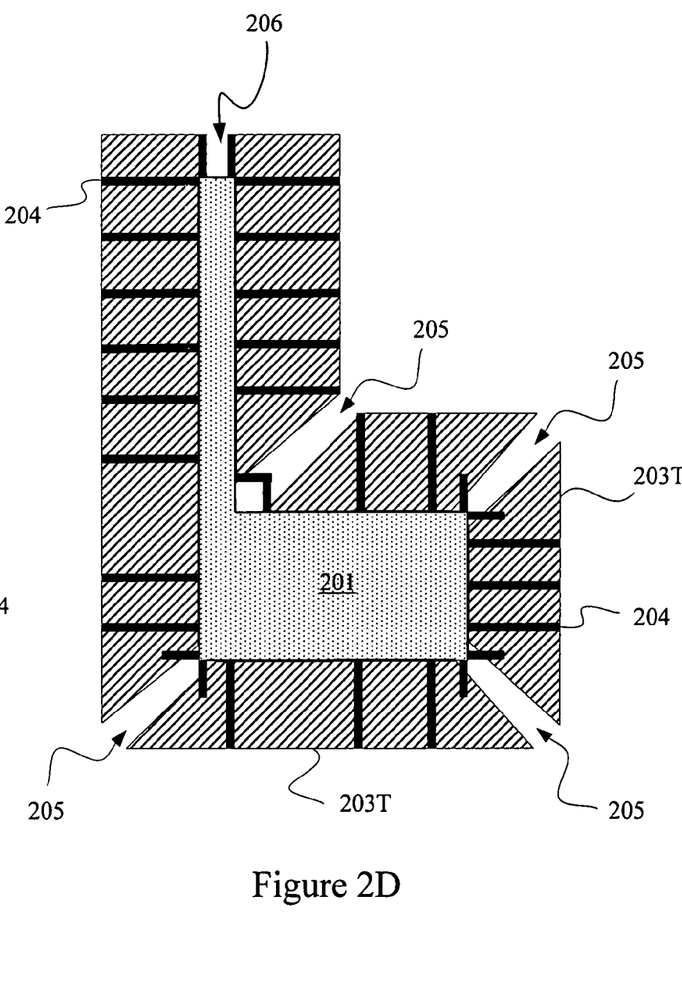
FIG. 2D illustrates exemplary cuts that can be made to the pre-shifter and the trim regions. In this case, cuts can be made at both the inner and outer corners of the feature.

In FIG. 2D, cuts 205 have been made to pre-shifter 203 at some of the inner and outer corners of feature 201. (Note that cuts 205 can trigger a corresponding retraction of the trim region adjacent such cuts. Thus, the trim regions would not extend to cuts 205.) A cut 206 has also been made to pre-shifter 203 at a line end of feature 201. In one embodiment, pre-shifter 203 and the trim region (not shown) can be shortened so that the trim region can define the line end of feature 201 (in other words, the edge of the trim region coincides with the edge of this line end). Cuts 205 and 206 are designed to comply with design rules and facilitate mask manufacturability, e.g. maintain minimum separation between adjacent shifters. In addition to corners, other locations such as the back of T-junctions could be cut to open up additional possibilities for phase assignment.

In FIG. 2D, most dissection points 204 have been extended to the edge of the pre-shifter (for illustration purposes to better show the tiles). In one embodiment, dissection points 204 define a plurality of shifter tiles 203T (and trim tiles, not shown). Of importance, the formation of shifter tiles 203T can facilitate the determination of the appropriate phase for each tile. Note that the dissection points associated with cuts 205 and 206 are not extended. Further details regarding the shapes and placement of cuts 205 and 206 as well as the resulting shapes of shifter tiles 203T are described in U.S. patent application Ser. No. 10/085,759, entitled "Design and Layout of Phase Shifting Photolithographic Masks", filed on Feb. 28, 2002, and incorporated by reference herein.

Note that shifter tiles 203T can initially have the same predetermined phase. For example, all shifter tiles 203T could be assigned a 0 degree phase in FIG. 2D. In another embodiment, shifter tiles 203T could initially have a phase set assigned by a conventional tool. At this point, each shifter tile 203T can be individually analyzed.

In this analysis, a simulation can be performed on each shifter tile 203T for each phase. The simulation can indicate the image contrast (and edge location) provided by each shifter tile 203T at a predetermined point (or points) on the edge of feature 201 (e.g. the evaluation points used by model-based OPC). (Determining the image contrast and edge location for a shifter tile is explained in further detail in reference to FIG. 3A. However, a summary explanation of that simulation is now provided to describe FIGS. 2D–2F.)

Of importance, the simulation for a shifter tile 203T is performed for each phase, i.e. two simulations can be performed, one simulation at 0 degrees and another simulation at 180 degrees. These two simulations will output different values for the image contrast (and edge locations) provided by the respective phases. In accordance with one feature of the invention, the phase providing the higher contrast can be selected as the 1$^{st}$ iteration shifter tile phase. If OPC is being performed simultaneously, it can be used to adjust the edge location at this time. In one embodiment, a post-OPC comparison is done of the two phase assignments, e.g. contrast same phase after OPC vs. contrast opposite phase after OPC.

At this point, the next shifter tile 203T can be analyzed. In one embodiment, the analysis can proceed in a predetermined direction, i.e. clockwise or counter-clockwise, around feature 201. Note that the analysis of each shifter tile 203T builds on the previously assigned 1$^{st}$ iteration shifter tile phases. In one embodiment, after all shifter tiles 203T have been analyzed and 1$^{st}$ iteration shifter tile phases have been assigned, then at least one more iteration can be performed, thereby confirming and/or modifying the assignments made during the 1$^{st}$ iteration.

Figure 2E:
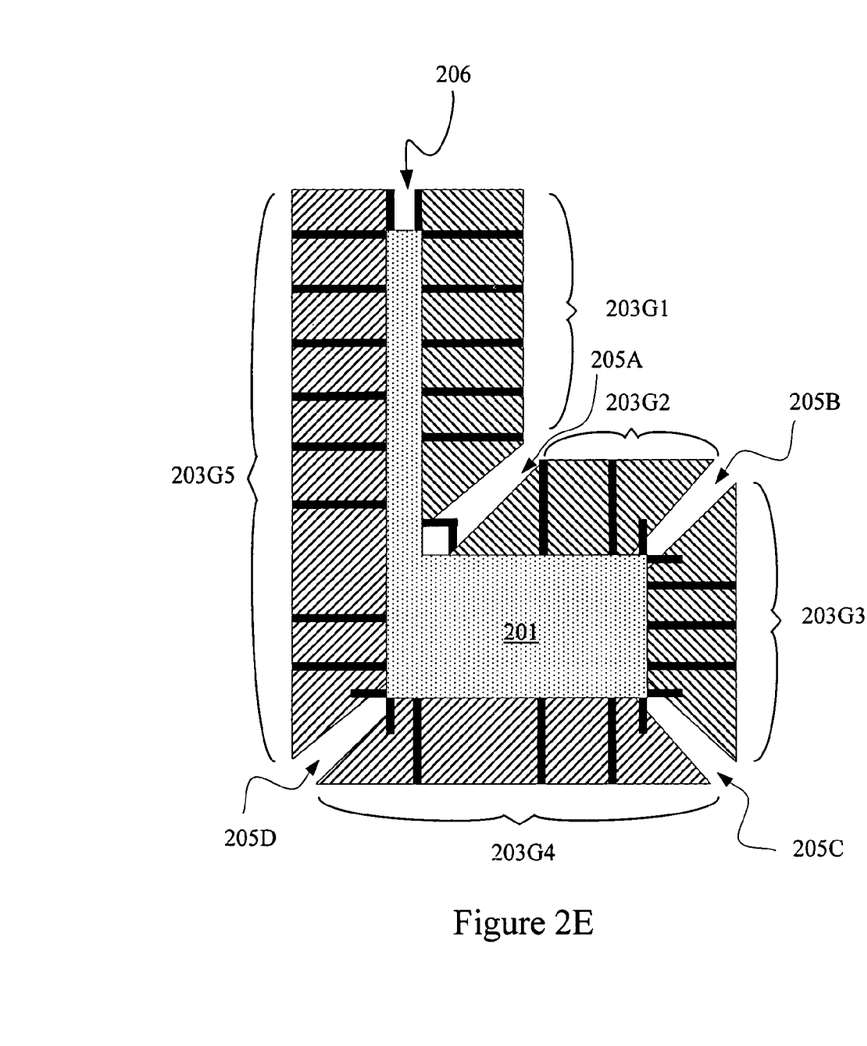
FIG. 2E illustrates the phase assignments of the feature after at least a first iteration.

FIG. 2E illustrates the phase assignments of feature 201 after the first iteration. In this example, based on assigning the phase providing the higher contrast for each shifter tile, shifter tile groups 203G1, 203G2, and 203G3 have been assigned an opposite phase to shifter tile groups 203G4 and 203G5. Note that the shifter tiles opposite each other, e.g. the shifter tiles in shifter tile group 203G1 and the uppermost shifter tiles in shifter tile group 203G5, have been assigned opposite phase, which is consistent with standard algorithm- or rule-based phase assignment. However, unlike the assignment dictated by phase dependencies, the manipulation of the pre-shifter provides a simulation-based assignment of phase, which ensures optimal edge resolution for feature 201. Therefore, in one embodiment shown in FIG. 2G, shifter tiles opposite each other (e.g. the shifter tiles in shifter tile group 203G1 and a set of the shifter tiles in shifter tile group 203G5) can have same phase assignments.

Note that the image contrast for a shifter tile might not significantly change between phase assignments, particularly where the shifter tile is abutting a large portion of a feature. In such a case, an analysis of an adjacent shifter tile could be performed. Specifically, if a shifter tile is out of phase with an adjacent shifter tile, then performing OPC of the layout can be difficult. Thus, if an adjacent shifter tile has a significant image contrast improvement using one phase assignment over another phase assignment, then both the adjacent shifter tile as well as the shifter tile not exhibiting significant differences between phase assignments can be assigned the same phase, i.e. the phase providing the higher image contrast for the adjacent shifter tile.

Figure 2F:
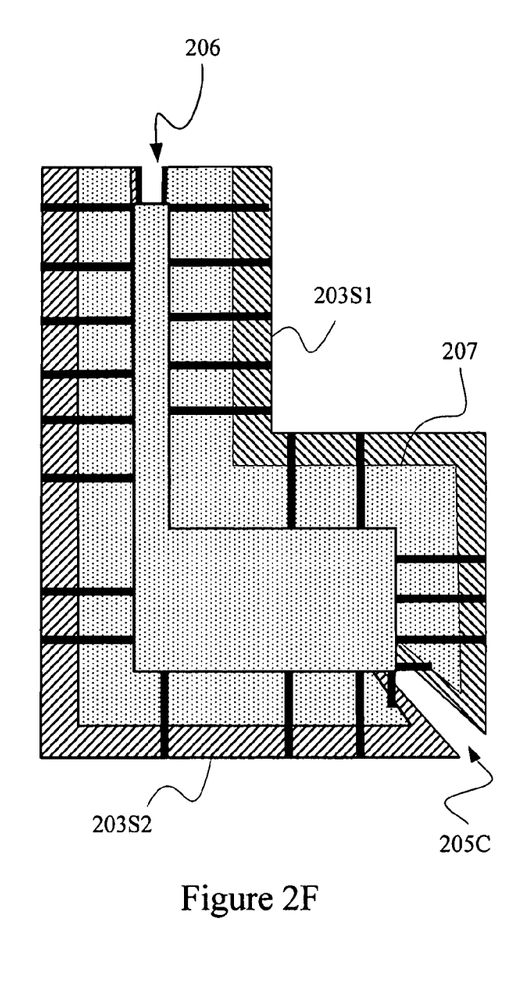
FIG. 2F illustrates the merging of certain shifter tile groups into shifters of a certain phase, thereby simplifying the manufacturability of the PSM mask. If shifter tile groups are merged, their corresponding trim mask tiles can also be merged, thereby simplifying the manufacturability of the trim mask.
Figure 2G:
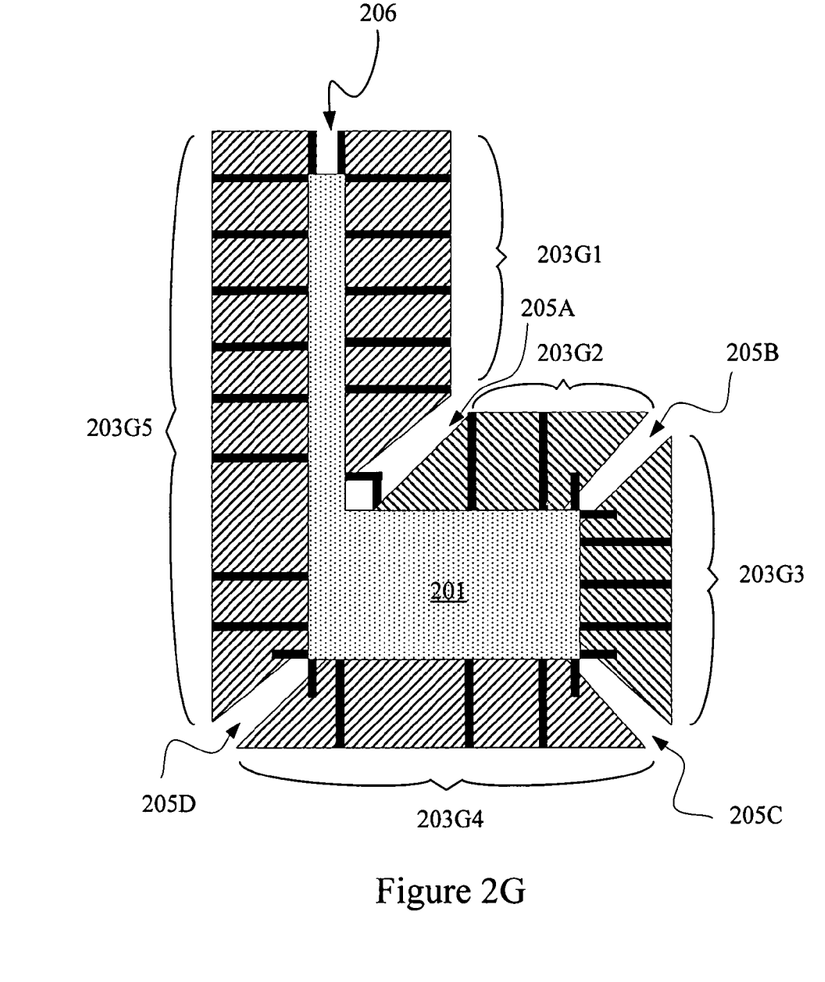
FIG. 2G illustrates a feature with shifter tiles opposite each other having the same phase assignments.
Figure 2H:
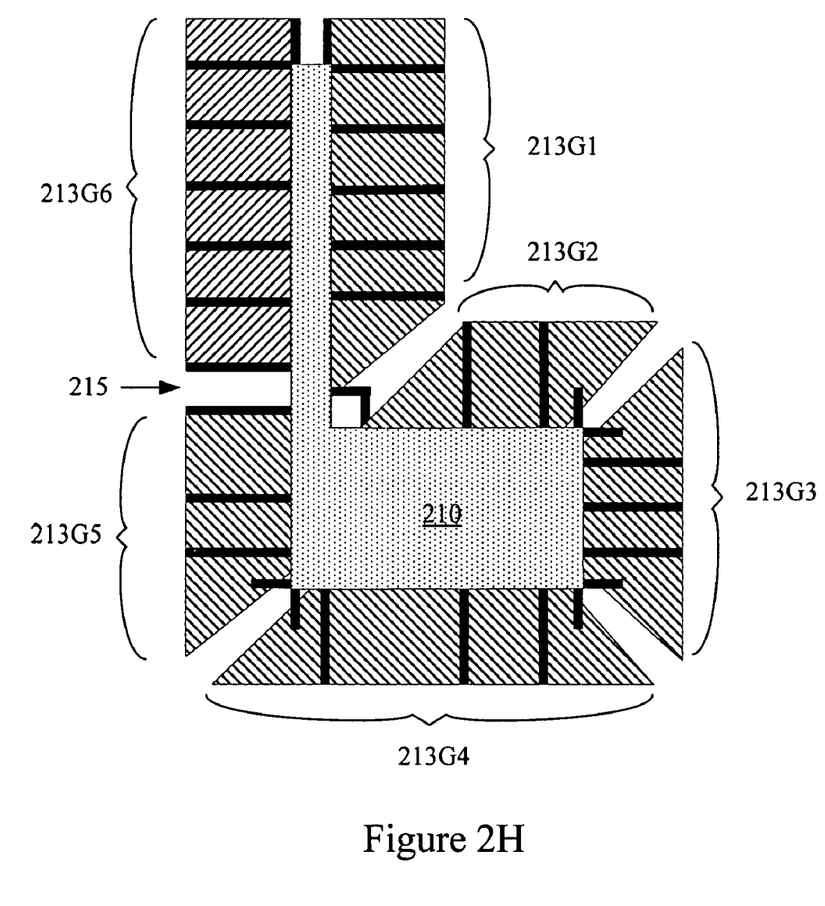
FIG. 2H illustrates a plurality of shifter tiles abutting a feature, wherein certain shifter tiles might not exhibit significant differences in image contrast.

In one embodiment, shifter tiles not exhibiting significant differences in image contrast can be assigned their phase after shifter tiles exhibiting significant differences in image contrast. For example, FIG. 2H illustrates a plurality of shifter tiles abutting a feature 210. In this case, shifter tile groups 213G2–213G5 might not exhibit significant differences in image contrast, whereas shifter tile groups 213G1 and 213G6 might exhibit significant differences in image contrast. Therefore, shifter tile groups 213G2–213G5 could be assigned phase after the phase assignment of shifter tile groups 213G1 and 213G6. In one embodiment, to simplify OPC, shifter tile groups 213G2–213G5 could be assigned the same phase. For this reason, a shifter tile between shifter tile groups 213G5 and 213G6 can instead be used for a cut 215.

Referring back to FIG. 2E, to improve manufacturability, cuts that were previously made between shifter tile groups 203G can be reviewed for continued relevancy. Specifically, cuts 205A and 205B have been made between shifter tile groups 203G1, 203G2, and 203G3, which have the same assigned phase. Similarly, cut 205D was made between shifter tile groups 203G4 and 203G5, which also have the same assigned phase (albeit opposite of shifter tile groups 203G1, 203G2, and 203G3). To simplify the manufacturing of shifters on the PSM, cuts can be limited to those between shifter tile groups of different phase. Thus, as indicated in FIG. 2F, cuts 205A, 205B, and 205D can be eliminated, thereby merging shifter tile groups 203G1, 203G2, and 203G3 into a shifter 203S1 of a first phase and shifter tile groups 203G4 and 203G5 into another shifter 203S2 of another phase. In contrast, cuts 205C and 206 can be retained because they separate shifters tile groups (now shifters 203S1 and 203S2) of different phase. Note that a trim region 207 corresponding to shifters 203S1 and 203S2 is also shown.

Figure 2I:
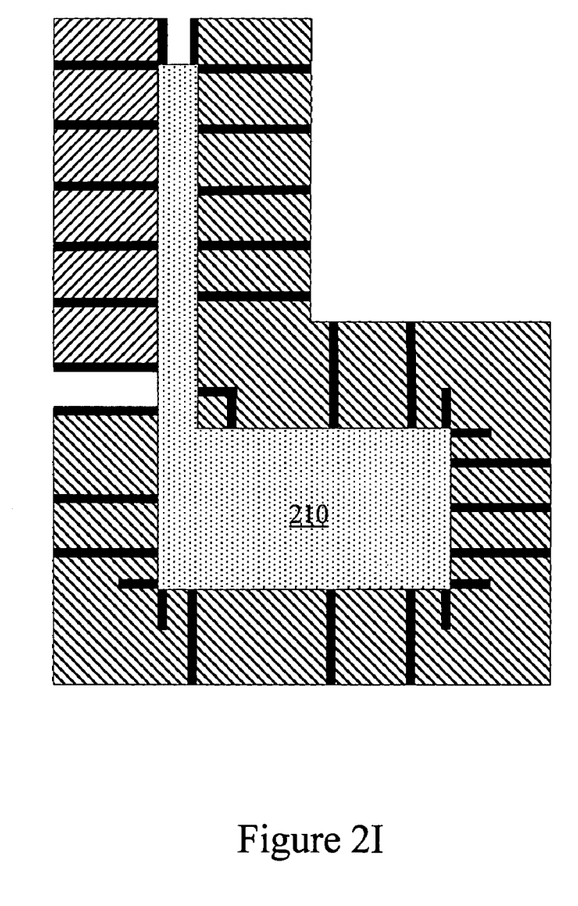
FIG. 2I illustrates a merge operation in which cuts between certain shifter tile groups can be eliminated, thereby merging those shifter tile groups into a single shifter of one phase.

Similarly, as indicated in FIGS. 2H and 2I, the cuts between shifter tile groups 213G1–213G5 can be eliminated, thereby merging those shifter tile groups into a single shifter of one phase. In contrast, cut 215 can be retained because it separates shifters tile groups 213G5 and 213G6 of different phase. Note that where the shifter tile groups are merged, the trim mask tiles can also be merged, thereby simplifying the manufacturability of the trim mask.

Figure 3A:
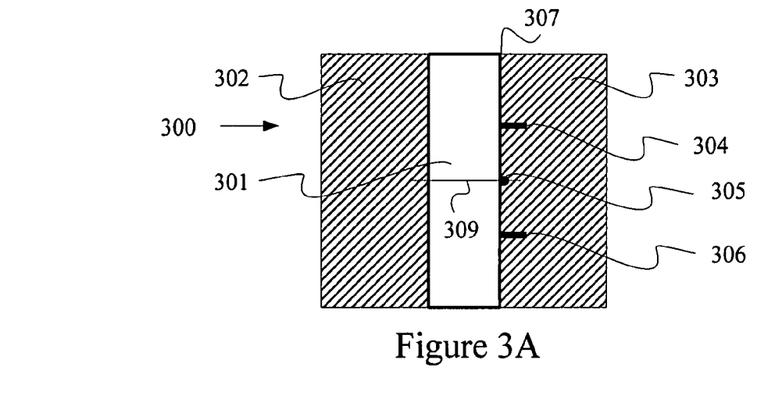
FIG. 3A illustrates a layout including one feature and two associated shifters of the same phase.

FIG. 3A illustrates a layout 300 including one feature 301 (in this case, a portion of a line) and shifters 302 and 303 (which are provided to facilitate the printing of feature 301). One edge 307 of feature 301 has been divided into segments using dissection points 304 and 306. Between dissection points 304 and 306 is an evaluation point 305, which can be used in a model-based tool to determine how to move (i.e. in or out) the segment of edge 307 defined by dissection points 304 and 306 to get the target critical dimension and locations printed on the integrated circuit. Other segments of edge 307 can also be manipulated using their respective evaluation points (not shown for simplicity). In layout 300 of FIG. 3A, shifters 302 and 303 have the same phase.

Figure 3B:
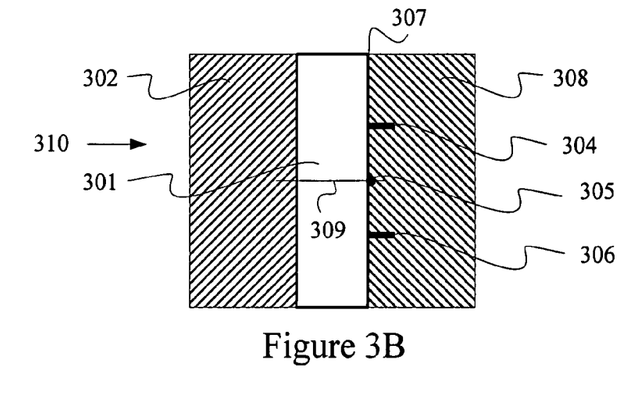
FIG. 3B illustrates a layout including the same feature as FIG. 3A, but in this layout having associated shifters of opposite phase.

FIG. 3B illustrates a layout 310 having an identical feature, i.e. feature 301. However, in layout 310, shifter 308 has replaced shifter 303, wherein shifter 308 has an opposite phase to shifter 302. In accordance with one feature of the invention, two simulations can be performed at evaluation point 305, wherein one simulation assumes the phase of shifter 303 and the other simulation assumes the phase of shifter 308.

Figure 3C:
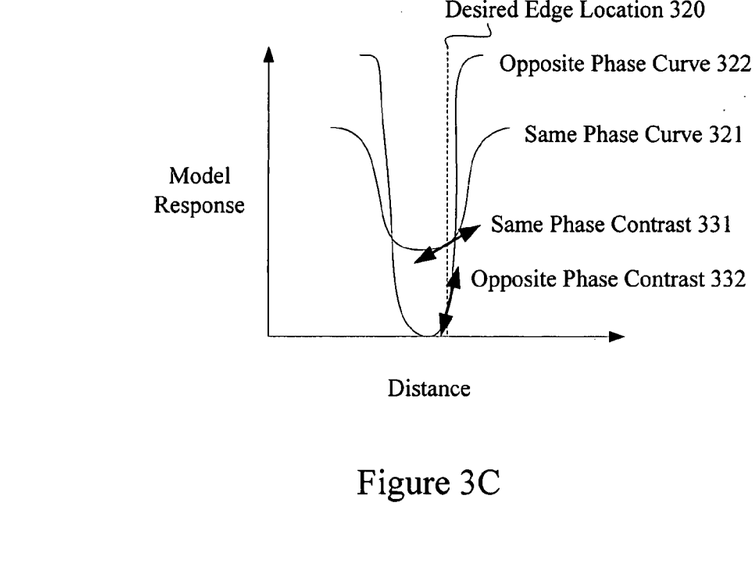
FIG. 3C illustrates a graph that plots model response, e.g. intensity, versus distance along a cut line that intersects an evaluation point on the feature.

FIG. 3C illustrates a graph that plots model response, e.g. intensity, versus distance along a cut line 309 (FIGS. 3A and 3B) that intersects evaluation point 305. In this graph, desired edge location 320 refers to the segment of edge 307 identified by evaluation point 305. For ease of reference, the results from both simulations have been superimposed onto the same graph, thereby emphasizing an advantage of model-based data conversion. Specifically, opposite phase curve 322 can reflect the simulation result for layout 310, whereas same phase curve 321 can reflect the simulation result for layout 300.

Of importance, at desired edge location 320, opposite phase curve 322 has an opposite phase contrast 332, whereas same phase curve 321 has a same phase contrast 331. Note that phase contrast is indicated using a vector, wherein the slope of the vector indicates how quickly the intensity changes, i.e. the magnitude of the contrast. In this case, the more vertical the slope, the greater/higher the contrast. The layout providing the higher contrast is preferably chosen to maximize the effect of using shifters. Because opposite phase contrast 332 has a steeper slope than same phase contrast 331, it would be desirable to use layout 310 rather than layout 300.

Figure 3D:
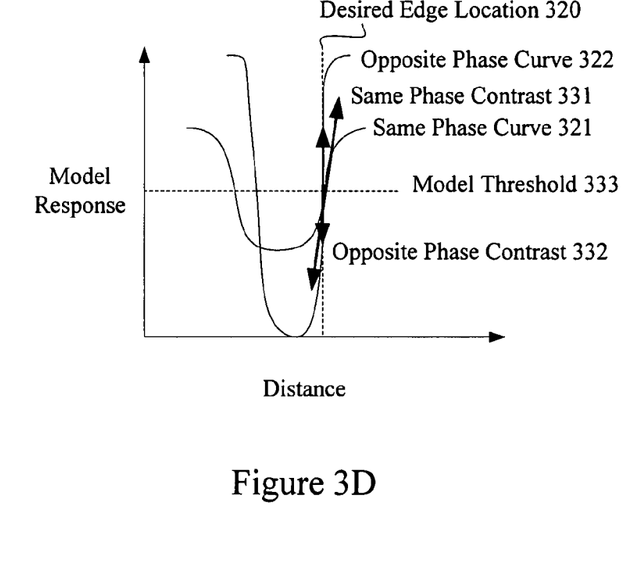
FIG. 3D illustrates the graph of FIG. 3C including the effects of OPC.

In accordance with one feature of the invention shown in FIG. 3D, optical proximity correction (OPC) can be employed on one or both layouts to ensure that opposite phase curves 322 and same phase curve 321 intersect desired edge location 320 at a model threshold 333. Model threshold 333, which is determined by photoresist reaction, indicates where edge 307 (more specifically, where the segment defined by dissection points 304 and 306 (and identified by evaluation point 305) will print.

The segment identified by evaluation point 305 can be biased using OPC in both layouts 300 and 310, thereby ensuring that the feature will print properly regardless of which phase is used. Additionally, the shifters themselves could be biased and/or modified as a form of OPC. In this manner, the overall accuracy when comparing the two phase contrasts can be improved. For example, in FIG. 3D, same phase contrast 331 has a higher contrast if layout 300 uses OPC (compare to same phase contrast 331 in FIG. 3C).

However, because opposite phase contrast 332 has a steeper slope than same phase contrast 331, it would still be desirable to use layout 310 rather than layout 300. Note that this result, i.e. a layout feature defined by opposite phase shifters provides better contrast with or without OPC, is not necessarily true in other embodiments. In fact, one advantage of model-based data conversion is that standard phase dependency requirements can be replaced with an simulation-based comparison, thereby ensuring for each segment that the most appropriate shifter phase is assigned.

Figure 4A:
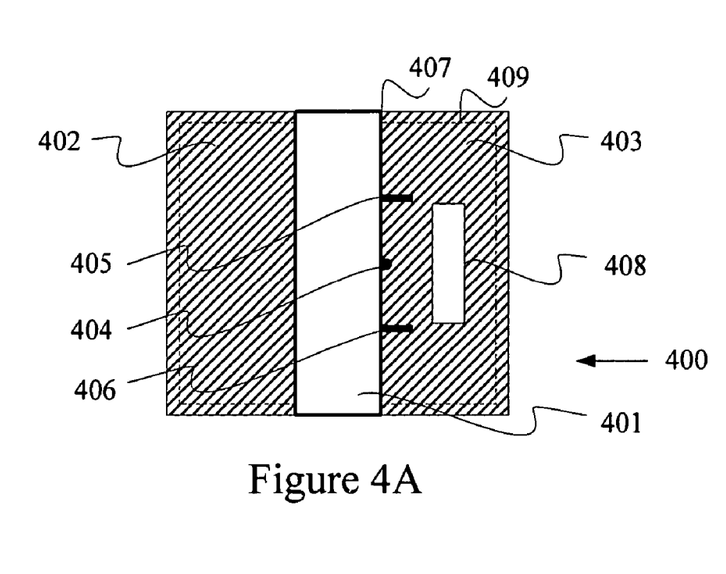
FIG. 4A illustrates an exemplary OPC feature that can be placed in a layout to improve the resolution of the printed feature.

OPC corrections used in conjunction with model-based data conversion could include assist features. For example, as shown in FIG. 4A, an assist feature 408 could be placed inside a shifter region in a layout 400 for improving the OPC of feature 401. Note that an edge 407 of feature 401 has been divided into segments by dissection points 405 and 406. An evaluation point 404 can be used to manipulate the segment defined by dissection points 405 and 406. Assist feature 408, which can be formed from chrome (as is feature 401), can be placed inside a shifter 403 to supplement the correction provided by moving the segment identified by evaluation point 404. Providing assist features inside a shifter is described in further detail in U.S. patent application Ser. No. 09/669,359, entitled "Phase Shift Masking For Complex Patterns", filed Sep. 26, 2000, which is incorporated by reference herein.

In one embodiment, if biasing of this segment and phase assignment (i.e. of shifters 402 and 403) fails to provide the correction necessary to printed edge 407 at its desired edge location, then assist feature 408 could be used in lieu of or combination with biasing. Note that assist feature 408 can be positioned inside a trim region 409 or inside shifter 403.

Figure 4B:
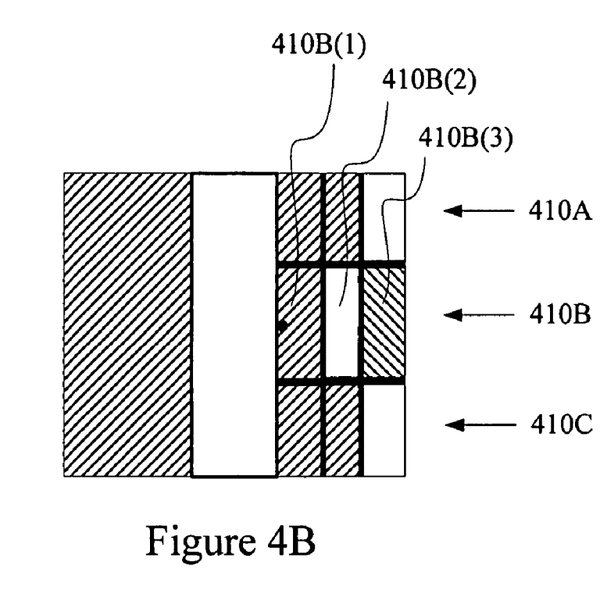
FIG. 4B illustrates multiple shifter tiles further divided into multiple shifter tile segments.

In one embodiment of the invention, a shifter tile can be divided into shifter tile segments for further analysis. For example, FIG. 4B illustrates shifter tiles 410A, 410B, and 410C, wherein each shifter tile (e.g. shifter tile 410A) can be divided into three shifter tile segments. Thus, by performing a two-dimensional dissection of the phase region, shifter tile 410B can include shifter tile segments 410B(1), 410B(2), and 410B(3). In accordance with one feature of the invention, each shifter tile segment can be analyzed to determine if optimal contrast is achieved with 0 degree phase, 180 degree phase, or chrome (i.e. an assist feature). To facilitate manufacturing, the phase of an adjacent tile segment can be flipped to the same phase or chrome. For example, assuming that 410B(1) and 410B(3) are assigned opposite phase (shown in FIG. 4B by different fill patterns), then 410B(2) can be formed from chrome (shown as a white fill pattern). Note that this assignment can then affect other shifter tile segments adjacent shifter tile segment 410B(3)(specifically, shifter tile segments adjacent to shifter tile segment 410B (3), but in shifter tiles 410A and 410C can be flipped to chrome).

Figure 5:
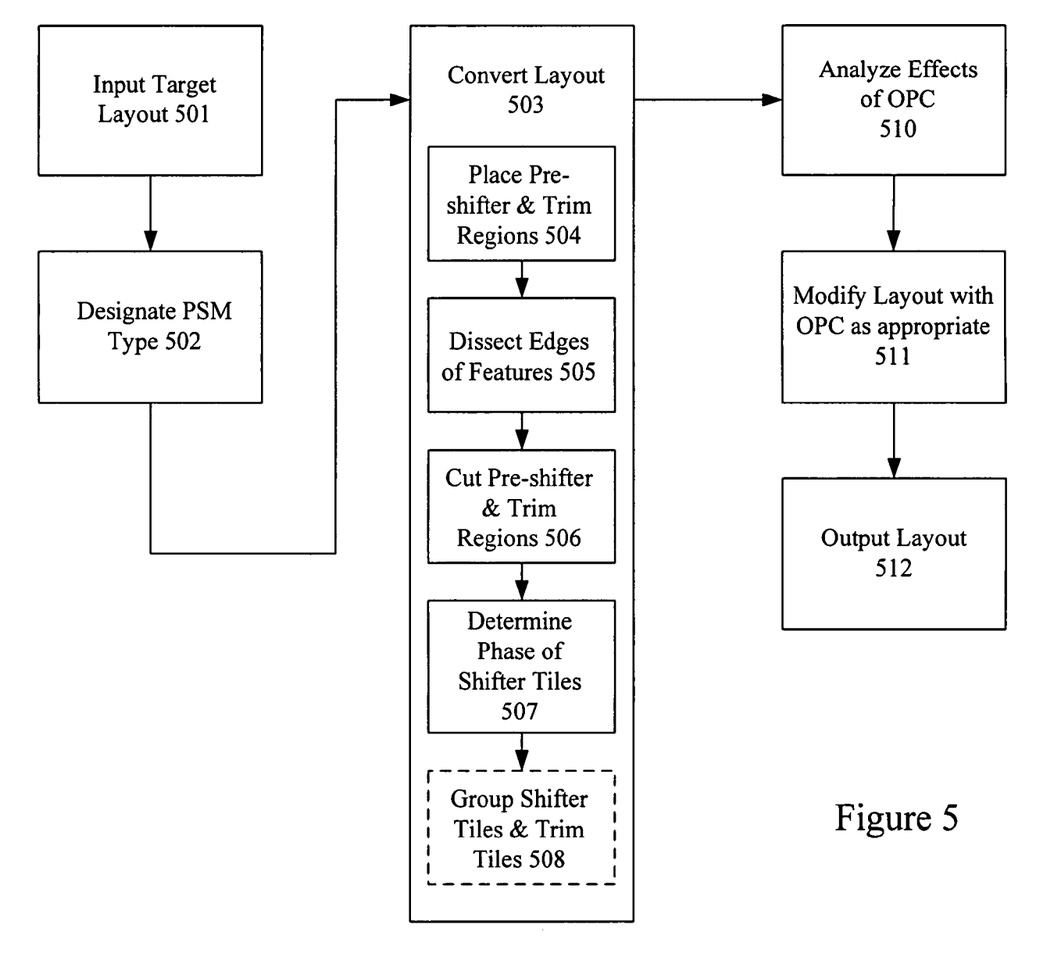
FIG. 5 illustrates one process flow embodiment of model-based data conversion.

FIG. 5 illustrates one process flow embodiment of model-based data conversion. In step 501, the target layout can be input to a tool. This target layout can include a file in a GDS-II stream format. Note that the GDS-II stream format file can include information regarding one or more layers (e.g. the phase layer for a PSM as well as the trim layer). The PSM type, e.g. double exposure dark-field PSM and corresponding bright field trim mask, can be designated in step 502.

In accordance with one feature of the invention, the layout can be converted in a model-based environment in step 503. Specifically, in step 504, pre-shifters (and trim regions) can be placed relative to the features in the layout. The edges of those features can be dissected in step 505, thereby forming a plurality of segments with associated evaluation points thereon.

In step 506, cuts can be made, as appropriate, to the pre-shifters (as well as the trim regions). In one embodiment, the cuts can be made to the pre-shifters and the trim regions at the corners of the features as well as other suitable cutting locations, e.g. back of T-junctions. As indicated with respect to FIG. 2D, line ends or locations where the trim region actually defines a feature edge may not have cuts. The locations, sizes, and shapes of the cuts can be process and design dependent. Further details regarding these cuts are provided in U.S. patent application Ser. No. 10/085,759, entitled "Design and Layout of Phase Shifting Photolithographic Masks", filed on Feb. 28, 2002, and incorporated by reference herein. The dissection points can be extended to the outside borders of the trim regions and the pre-shifters, thereby generating both trim tiles and shifter tiles in the layout. At this point, all shifter tiles are assumed to be of one phase, e.g. 0 degree phase.

In step 507, the phase of each shifter tile can be determined by analyzing the contrast provided by 0 degree phase as well as 180 degree phase. Of importance, the phase providing the higher contrast is chosen for that shifter tile. Moreover, the phase analysis of subsequent phase tiles is performed based on the previous phase selections. In this manner, instead of rules that are automatically applied, phase assignment is performed using an simulation-based selection process, thereby ensuring that the most lithographically appropriate phase is selected for each shifter tile. Note that once phases are assigned to all the shifter tiles, one or more iterations of this selection process can be performed. In this manner, the phase selection can be yet further improved. In some embodiments, OPC of the shifters and the feature edges are applied concurrently with step 507 to ensure better comparisons. Adjacent shifter tiles of the same phase can be optionally grouped in step 508, thereby improving mask manufacturability.

In step 510, OPC can be performed by the same tool. Note that in one embodiment, this step can be performed at the same time as layout conversion in step 503. In other words, OPC and phase assignment in combination can be analyzed for each shifter tile. For example, assist features could be added in the shifters and/or trim regions (note that the sub-division of shifter tiles in two dimensions could also have occurred at step 507 to allow more fine-grained control of phase assignment). Note that this comprehensive approach allows modifications that could not be done before in layout design. For example, using data from other evaluation points (i.e. those evaluation points proximate to the feature), the size of a shifter can be changed, thereby eliminating a potential phase conflict with a neighboring feature. Thus, as appropriate, the layout can be modified using OPC in step 511.

Finally, in step 512, an output layout is generated. This output layout can include one or more layouts and/or layers to define patterns for one or more masks and/or layers of a mask. For example, the output layout can include a GDS-II stream file having one or more phase layers and a trim layer. In one embodiment in which the file format does not designate phase, the 0 degree and 180 degree shifters can be separated into different layers to assist in the mask manufacturing process.

Embodiments of the invention can include computer software for performing the steps described in reference to FIG. 5, e.g. placing the pre-shifters around the features, dividing the pre-shifters into shifter tiles, determining the contrasts provided by the simulation images using different phases, and selecting the appropriate phases for the shifters. The computer software can include a source code segment for dividing the pre-shifters using dissection points. The computer software can further include a source code segment for dividing the shifter tiles into shifter segments, thereby allowing even more detailed analysis to be performed. A source code segment can also be provided for grouping a set of adjacent shifter tiles having a same phase to simplify manufacturing of the PSM. Finally, a source code segment can be provided for including OPC in at least one shifter tile.

Embodiments of the invention can also include a photolithographic mask manufactured with a layout generated using model-based data conversion. The photolithographic mask can include a dark field mask having a plurality of shifters. The process shown in FIGS. 2A–2F can be used to define the shifters. Specifically, a pre-shifter can be placed proximate to the edges of a feature on the layout. The pre-shifter can be divided into a plurality of shifter tiles. First and second contrasts provided by assigning first and second phases, respectively, to a shifter tile can be determined as shown in FIGS. 3C/3D. A phase for the shifter tile can be selected based on the step of determining the contrasts. The steps of determining the contrasts and selecting the phase can be repeated for other shifter tiles. In one embodiment, the effect of optical proximity correction (OPC) for one or more shifter tiles can be analyzed in conjunction with phase assignment. The process can be repeated for other features.

Embodiments of the invention can include a tool for defining a layout for a phase shifting mask (PSM). The tool can means for performing the model-based data conversion described in reference to FIG. 5. For example, the tool can include means for comparing a first contrast provided by assigning a first phase to a shifter on the layout and a second contrast provided by assigning a second phase to the shifter, means for selecting whichever of the first and second phases provides an overall better contrast, and means for repeating the steps of comparing and selecting for multiple shifters on the layout. The tool can further include means for providing optical proximity correction (OPC) associated with at least one shifter as well as means for modifying characteristics of that shifter. In one embodiment, the means for comparing and providing perform simulations. Of importance, the means for repeating and providing can be structured without streaming there between.

Model-based data conversion can change feature edges, create geometries along the edges of the feature, size these geometries, and perform operations between layers. For example, the OPC engine can create error layers with shapes indicating locations where the OPC process was unable to fully correct an edge. Similarly, some layout pre-processing of corners can be performed to reduce OPC time, e.g. adding serifs etc. Thus, the previously one-dimensional OPC analysis (i.e. biasing segments of a feature edge) can be transformed into a two dimensional data conversion (i.e. assigning phase to shifters, which were tailored for specific locations on the feature, as well as biasing segments of the feature edge). This increased functionality can advantageously reduce total simulation time while providing increased accuracy in both phase assignment and OPC.

In the context of a full-phase process (in which substantially all of the features in the layout are phase-shifted) where shifters are placed, colored, and then finalized, the approach described herein can be used to assign phase to shifters in the place of, in addition to, and/or in combination with cost functions. For example, turning to the process described in U.S. patent application Ser. No. 10/085,759, filed Feb. 28, 2002, entitled "Design And Layout Of Phase Shifting Photolithographic Masks", having inventors Michel Luc Côté and Christophe Pierrat, and assigned to the assignee of the present invention, the shifter tile and modeling approach could be used for phase assignment for a single pre-shifter (or shifter shape) or even a group of shifters.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. For example, in one embodiment, the selected phase of a shifter tile could be a function of the contrast at the evaluation point of the shifter tile as well as predetermined neighboring (e.g. within proximity range) evaluation points. In another example, using image contrast for phase selection can be particularly helpful with large features, such as contacts, in the layout. Specifically, image contrast may actually determine that no phase shifting should be done to large features. In other words, the pre-shifter can be kept intact, thereby lithographically having the same effect as a standard binary mask. In yet another embodiment, pre-shifters could be added inside a large feature. The pre-shifter(s) could be manipulated (i.e. cut and colored) in a process similar to that described in reference to FIGS. 2C–2F.

In yet another embodiment, process latitude can replace the contrast of the image as a metric. Specifically, a normal change in dose and focus for the printed edge can be used to evaluate critical dimension (CD) error ranges. For example, referring to Table 1 below, assume that when the dose changes by ±10% and focus ±200 nm (a normal process latitude), the model computes that the CD error ranges from ±12 nm when the phase is 0 degrees and ±13 nm when the phase is 180 degrees. In this case, 0 degree shifters could be selected to minimize the CD error range.

TABLE 1

| Process Latitude | Phase | CD Error Range |
|---|---|---|
| Dose: +/− 10%, Focus: +/− 200 nm | 0 degrees | +/− 12 nm |

TABLE 1-continued

| Process Latitude | | Phase | CD Error Range |
|---|---|---|---|
| Dose: | +/− 10%, | 180 degrees | +/− 13 nm |
| Focus: | +/− 200 nm | | |

Similarly, the range of process latitude for a given CD tolerance change, e.g. ±10%, could be computed for both phases at an evaluation point. For example, referring to Table 2 below, when the phase is set to 0, the process latitude might be ±17% for dose and ±260 nm for defocus, but ±20% for dose and ±300 nm for defocus when the phase is 180. In this example, 180 degree shifters could be selected to provide the greater process latitude.

TABLE 2

| CD Tolerance Change | Phase | Process Latitude | |
|---|---|---|---|
| +/− 10% | 0 degrees | Dose: | +/− 17%, |
| | | Focus: | +/− 260 nm |
| +/− 10% | 180 degrees | Dose: | +/− 20%, |
| | | Focus: | +/− 300 nm |

Finally, the system and methods described herein can be applied to any lithographic process technology, including ultraviolet, deep ultraviolet (DUV), extreme ultraviolet (EUV), x-ray, and ebeam. Accordingly, it is intended that the scope of the invention be defined by the following claims and their equivalents.

The invention claimed is:

1. A method of providing shifters on a layout, the method comprising:
   dissecting edges of a feature on the layout;
   defining the feature using a plurality of shifters, a placement of the plurality of shifters based on the dissecting;
   initially assigning each shifter of the plurality of shifters a first phase;
   comparing a first contrast provided by assigning the first phase to a shifter and a second contrast provided by assigning a second phase to the shifter;
   selecting whichever of the first and second phases provides a higher contrast; and
   repeating the steps of comparing and selecting for remaining shifters of the plurality of shifters.

2. The method of claim 1, further including providing optical proximity correction (OPC) associated with at least one shifter.

3. The method of claim 2, wherein the steps of providing OPC and comparing are performed before the step of selecting.

4. The method of claim 2, wherein the OPC includes placing an assist feature in the shifter.

5. The method of claim 2, performed by a single tool without streaming between the steps of repeating and providing OPC.

6. The method of claim 2, wherein the steps of comparing and providing ORC can be performed with simulation.

7. The method of claim 1, wherein characteristics of the shifter are generated by a model-based tool.

8. A tool for defining a layout for a phase shifting mask (PSM), the PSM for lithographically transferring a pattern onto a wafer, the pattern including a plurality of features, each feature including a plurality of edges, wherein at least one feature is defined by shifters having corresponding phases, the tool comprising:
   means for dissecting edges of a feature on the layout;
   means for defining the feature using a plurality of shifters, a placement of the plurality of shifters based on output provided by the means for dissecting;
   means for initially assigning each shifter of the plurality of shifters a first phase;
   means for comparing a first contrast provided by assigning the first phase to a shifter and a second contrast provided by assigning a second phase to the shifter;
   means for selecting whichever of the first and second phases provides an overall better contrast; and
   means for repeating the steps of comparing and selecting for remaining shifters of the plurality of shifters.

9. The tool of claim 8, further including means for providing optical proximity correction (OPC) associated with at least one shifter.

10. The tool of claim 9, wherein the means for repeating and providing OPC can be structured without streaming between steps of repeating and providing.

11. The tool of claim 9, wherein the means for comparing and providing OPC perform simulations.

12. The tool of claim 8, further including means for modifying characteristics of the shifter.

* * * * *